(12) United States Patent
Rawson et al.

(10) Patent No.: US 8,885,340 B2
(45) Date of Patent: Nov. 11, 2014

(54) DUAL-PERFORMANCE LOW NOISE AMPLIFIER FOR SATELLITE-BASED RADIOFREQUENCY COMMUNICATION

(75) Inventors: Stephen Rawson, Labastide d'Anjou (FR); Benoit Fauroux, Castelnaudary (FR); Remi Rayet, Toulouse (FR); Thomas Bonhoure, Avignonet Lauragais (FR); Cedric Chambon, Villefranche Lauragais (FR)

(73) Assignee: Callisto France, Villefranche-de-Lauragais (FR)

( * ) Notice: Subject to any disclaimer, the term of this patent is extended or adjusted under 35 U.S.C. 154(b) by 181 days.

(21) Appl. No.: 13/382,634

(22) PCT Filed: Jul. 7, 2010

(86) PCT No.: PCT/EP2010/059693
§ 371 (c)(1),
(2), (4) Date: Jan. 19, 2012

(87) PCT Pub. No.: WO2011/003929
PCT Pub. Date: Jan. 13, 2011

(65) Prior Publication Data
US 2012/0140413 A1 Jun. 7, 2012

(30) Foreign Application Priority Data

Jul. 8, 2009 (FR) .................................... 09 54739

(51) Int. Cl.
*H05K 7/20* (2006.01)
*H03F 3/189* (2006.01)
(Continued)

(52) U.S. Cl.
CPC . *H03F 1/26* (2013.01); *H03F 3/189* (2013.01)
USPC ............... 361/688; 361/679.46; 361/679.54; 361/704; 361/714; 165/80.2; 165/104.33; 455/254; 455/561

(58) Field of Classification Search
CPC ............ H05K 7/20; H03F 1/26; H03F 17/00; H03F 3/189; H04M 1/00; H04B 1/38; F25B 21/02; F25B 23/12
USPC .......... 361/679.46, 679.53, 679.54, 704, 714, 361/715, 716, 816, 818, 831; 165/80.2, 165/80.3, 104.33, 48.1, 51.1; 174/50, 174/50.52, 520; 252/301.4 R, 301.18, 252/341.1; 455/254, 130, 140, 151.2, 300, 455/561; 62/3.7, 51.1, 259.2; 372/6, 40; 330/1 R, 56, 59, 269, 302, 289; 313/239, 246
See application file for complete search history.

(56) References Cited

U.S. PATENT DOCUMENTS 3,203,477 A * 8/1965 Collard ..................... 165/48.1
3,582,805 A * 6/1971 Kliphuis ..................... 330/56
(Continued)

FOREIGN PATENT DOCUMENTS

EP          1 014 480          6/2000

OTHER PUBLICATIONS

International Search Report dated Nov. 24, 2010, corresponding to PCT/EP2010/059693.
(Continued)

*Primary Examiner* — Michail V Datskovskiy
(74) *Attorney, Agent, or Firm* — Young & Thompson (57) ABSTRACT

A low noise amplifier device for receiving a radio frequency signal from a satellite contains an amplifier kept in a sealed chamber in a cryostat, and a cryogenic cooler mounted on the outside of the cryostat. The amplifier is: maintained in the sealed chamber attached to a cold finger of the cryogenic cooler, made of a material with good heat conductivity and without direct contact with the wall of the cryostat; connected to the input and output coupler, each traversing the wall of the cryostat; functional at room temperature and at least one cryogenic temperature well below room temperature; and the sealed chamber of the cryostat contains a gas at a pressure between a pressure close to the pressure outside the cryostat and 0.1 millibar.

15 Claims, 4 Drawing Sheets

(51) Int. Cl.
*H03F 1/26* (2006.01)
*H04B 1/38* (2006.01)
*F25B 21/02* (2006.01)

(56) References Cited

U.S. PATENT DOCUMENTS

| | | | |
|---|---|---|---|
| 3,694,753 A * | 9/1972 | Arndt | 455/196.1 |
| 4,585,999 A * | 4/1986 | Hilbert et al. | 330/61 R |
| 4,996,188 A * | 2/1991 | Kommrusch | 505/210 |
| 5,010,304 A * | 4/1991 | Mueller et al. | 330/269 |
| 5,106,826 A * | 4/1992 | Alford et al. | 505/202 |
| 5,959,444 A * | 9/1999 | Casper | 323/313 |
| 6,104,934 A | 8/2000 | Patton et al. | |
| 6,205,340 B1 * | 3/2001 | Yandrofski et al. | 455/561 |
| 6,212,404 B1 * | 4/2001 | Hershtig | 455/561 |
| 6,263,215 B1 * | 7/2001 | Patton et al. | 455/561 |
| 6,367,266 B1 * | 4/2002 | Kobayashi et al. | 62/51.1 |
| 6,480,706 B1 * | 11/2002 | Mimura et al. | 455/140 |
| 6,571,110 B1 * | 5/2003 | Patton et al. | 455/561 |
| 6,688,127 B2 * | 2/2004 | Laubacher et al. | 62/259.2 |
| 6,698,224 B2 * | 3/2004 | Kagaya et al. | 62/259.2 |
| 6,711,912 B2 * | 3/2004 | Laubacher et al. | 62/259.2 |
| 6,963,758 B2 * | 11/2005 | Narahashi et al. | 455/561 |
| 6,999,741 B2 * | 2/2006 | Hattori | 455/254 |
| 7,395,091 B2 * | 7/2008 | Kapoor et al. | 455/560 |
| 7,795,965 B2 * | 9/2010 | Suzuki et al. | 330/59 |
| 8,606,321 B2 * | 12/2013 | Lukkarila | 455/561 |
| 2004/0041655 A1 * | 3/2004 | Kai et al. | 333/99 S |
| 2004/0162042 A1 * | 8/2004 | Chen et al. | 455/130 |

OTHER PUBLICATIONS

Robert R. Romanofsky et al.; "A Cryogenic K-Band Ground Terminal for NASA's Direct-Data-Distribution Space Experiment"; IEEE Transactions on Microwave Theory and Techniques, IEEE Service Center, vol. 48. No. 7, Jul. 1, 2000.

C. Alina et al; "Characterization techniques for temperature-dependent experimental analysis of microwave transistors"; IMTC 2001. Proceedings of the 18th. IEE Instrumentation and Measurement Technology Conference; vol. 3 pp. 1893-1896; May 21, 2001.

* cited by examiner

DUAL-PERFORMANCE LOW NOISE AMPLIFIER FOR SATELLITE-BASED RADIOFREQUENCY COMMUNICATION

FIELD OF INVENTION

The present invention relates to the field of equipment used to communicate between satellites and general space objects, and fixed or mobile ground stations.

More particularly, the invention relates to a high frequency low noise amplifier used in RF reception chains.

The invention also relates to a method of implementation of the amplifier of the invention, to improve the quality of communications between a satellite or a space object and a ground station.

BACKGROUND OF INVENTION

Today the communications between the ground and moving objects above the earth's atmosphere (satellites and space objects in general) are made almost exclusively by radio frequency signals and because of the increasing demand for channels and bandwidth, higher and higher frequencies are used.

Due to the congestion of radio frequency bands currently used for communication with satellites, bands L, S, C and Ku, and with X-band reserved for military applications, it has become very difficult to obtain new allocations of channels in the frequency range of 1 GHz to 18 GHz as covered by these bands.

Link systems with satellites are therefore moving towards the use of even higher frequencies of 18 GHz to 40 GHz, referred to as bands K and Ka.

These higher frequencies implemented for these communications will produce real benefits.

Use of higher frequencies allows for higher bandwidths and thus facilitates dedicated broadband services that require a lot of data such as telephony, video conferencing, digital television, and especially high-speed satellite internet.

K and Ka bands are currently under-used, which facilitates the allocations of channels.

High frequencies can also allow the use of smaller antennas for a given antenna "gain", which is advantageous in many circumstances, especially for mobile installations or discreet military installations, and also for fixed installations in reducing the size of the antenna infrastructure.

This reduction in size of the antennas is also an advantage in the case of the tracking of space objects or during launch phases.

During the critical phases of satellite launch, orbit placement or orbit parking, a guarantee of quality of the link is required, which leads to the use of tracking antennas of large diameters. However, the control of the antenna tracking is complex not only because of the antenna size but also because of their high directivity.

Higher frequencies for communications is not without its difficulties because the high-frequency signals are in general (and especially the frequency bands K, Ka) sensitive to atmospheric phenomena.

In practice the propagation conditions deteriorate depending on local atmospheric characteristics where the receiving antenna is located. The signals are weakened especially by humidity and the presence of clouds or rain.

In the worst cases the signals from a satellite cannot be intelligibly received and the communication link is no longer available.

To overcome these difficulties and to maintain communication links with satellites and other space objects, several solutions are currently implemented.

One solution is to maintain communication by increasing the transmitter power when the conditions deteriorate to counter the attenuation introduced by the poor propagation conditions. Relatively simple to implement as long as this feature was built-in at the transmitter at the design stage, however, this solution causes interference and rapidly increases rates of intermodulation levels, which limits the possibilities of its use.

Another solution is to adapt the transmitted signal and reduce the bandwidth in order to match the available link budget. This solution is relatively complex to implement, lacks responsiveness and above all implies a lower transfer rate that may be incompatible with the expected service.

Other solutions are based on a technique of re-routing the transmission by another ground station or by a relay satellite, which can overcome local constraints where the transmission conditions between the ground and the satellite are unfavorable.

These solutions are very effective as they allow communications at the initial performance levels, but they are complex and imply a high cost due to the back-up ground stations.

These various solutions can if necessary be combined to improve the performance, or alternatively the specific components of a receiver chain can be improved, especially the size of the antenna or the sensitivity and signal to noise ratio of the receivers.

It is in this context that the option to cool the amplifiers is known to improve the signal to noise ratio, by reducing the internal noise of the amplifiers.

The components of the receiver (RF amplifiers, filters, etc.), in this case, are associated with a cryogenic cooler in an insulating enclosure such as a Dewar (named after the inventor) or cryostat to cool the components to a very low temperature of usually approximately 100 Kelvin or lower.

In typical system designs, components including the antennas are designed to meet the nominal performance in the worst conditions that can be encountered, during which the communication link must be maintained.

Atmospheric conditions leading to deterioration of propagation are generally localized and temporary, with the result that the systems are designed with significantly higher performance ratings than is required for a large proportion of their operational life.

The resulting increase in the complexity of the components and their maintenance, results in a significant increase in their build cost, operational costs and in a lower reliability.

SUMMARY OF INVENTION

To overcome these problems the invention proposes to produce a low noise amplifier that has two modes, a normal mode at ambient temperature and the other, an alternative mode at very low temperatures with enhanced characteristics.

The low noise amplifier of the invention is implemented in a device for receiving a radio frequency signal from a satellite or in general from a space object, is comprised of an amplifier (as the electronic component), kept in a sealed chamber defined by the walls of a cryostat, and of a cryogenic cooler fixed to one of the cryostat walls.

The amplifier is:
Mounted inside the sealed chamber and secured, either directly or via a plate onto the amplifier is secured, to a contact surface at the end of a cryogenic cooler's cold finger. The cold finger traverses the chamber wall of the cryostat without direct contact. Any mounting plate is made of a material a good conductor of heat.

Connected to an input coupler for the amplifier's input and an output coupler for the amplifier's output, each connecting through the wall of the cryostat.

Functional both at an ambient temperature of around 288 Kelvin (in effect the temperature at the Earth's surface at the location of the receiving device), and at least one pre-determined cryogenic temperature dramatically below room temperature.

And the sealed chamber of the cryostat contains at least during operation at cryogenic temperature, a gas at a pressure between the pressure outside the cryostat and a pressure of about 0.1 millibar.

Thus the low noise amplifier is able to be conceived with reduced dimensions despite the required cryogenic cooler, and having at least two modes, one of which operates without the cryogenic cooler operating. This mode reduces the energy consumption without compromising on the link budget with the satellite, and without a reduction in the reliability of the low noise amplifier.

In one embodiment, the input coupler includes an input waveguide's inner end attached to an amplifier input interface, and an outer end connected via a sealed window that traverses the wall of the cryostat (without any electrical discontinuity between the input of the amplifier and an antenna interface to connect to the waveguide window), and the output coupler comprising a waveguide arranged similarly at the output of the amplifier.

In another embodiment, the input coupler comprises a coaxial cable between the amplifier input and a sealed coaxial connector that traverses the wall of the cryostat, and the output coupler similarly comprises a coaxial cable between the amplifier output and a sealed coaxial connector through the wall of the cryostat.

In a preferred embodiment advantageously adapted to the input and output signals, the input coupler comprises a waveguide with an inner end attached to the amplifier input interface and an outer end fixed via a sealed window that traverses the wall of the cryostat (without any electrical discontinuity between the input of the amplifier and an interface for connecting an antenna to a waveguide window), and the output coupler comprising a coaxial cable between the amplifier output and a sealed coaxial connector through the wall of the cryostat.

In all cases where a waveguide is used as a coupler, in order to limit the transfer of heat between the inside and outside the cryostat, the waveguide(s) are made up primarily of a metallic material with low thermal conductivity, preferably less than 50 W/m·K, and includes in order to obtain the optimum performance of RF transmission on the inner surface of the waveguide, a thin deposit of a material of high electrical conductivity, preferably greater than $40 \times 10^6$ Siemens/m.

The metal material of low thermal conductivity is typically a stainless steel or an iron-nickel alloy containing approximately 36% nickel, such as Invar®, and the material of high electrical conductivity is typically of silver, copper or gold.

In another embodiment, in order to minimize thermal conduction between the inner chamber of the cryostat and the outside, at least one coupler traverses the wall through an opening or iris at the interface of a waveguide and includes a microstrip line with:

A microstrip of electrically conductive material

The micro-strip being attached to the upper face of a thin dielectric plate

The thin dielectric plate having a metallized layer on its lower surface opposite to the upper surface and forming an electrical ground The microstrip line extends at a first, free end, into the waveguide via an iris through the wall of the waveguide, without metal contact between the microstrip line and the wall of the waveguide The microstrip line extending at a second, inner end (opposite to the free end), to the vicinity of the amplifier without direct contact with the amplifier The microstrip line is without the metallized layer on the part of the microstrip line which is located inside the waveguide.

In order to maintain the microstrip line mechanically in the position it should occupy in the low noise amplifier, the microstrip line is maintained at the level of the iris in the wall of the waveguide, by resting on a plate of a high dielectric material so as not to impair the operation of the microstrip line, close to that of an antenna.

To ensure the mechanical strength of the microstrip line, consisting of a set of thin metallic and dielectric layers, the microstrip line is secured to a support arm.

In order that the support arm can extend over the longest possible length of the microstrip line without disturbing the radio and thermal properties of the low-noise amplifier, the support arm is secured to a bracket of the amplifier at the inner end of the microstrip line, and is fixed on the side of the free end of the microstrip line up until just before the free end, so as to be kept close to the wall of the waveguide. This supports the microstrip line along the longest possible length, without contact with the wall of the waveguide that may create thermal bridges.

The inner end of the coupler opposite the free end is located close to the amplifier and without contact with the amplifier to which the micro-strip line is connected by a connecting wire.

When such a coupler to the microstrip line is implemented, the other coupler can be of the same type or of one of the other possible forms considered, i.e. waveguide or coaxial cable.

To improve the quality of thermal insulation and reduce as much as possible the size and use of the cryogenic cooler, the sealed chamber is preferably filled with a thermally insulating material, for example a material with good insulating properties as achieved by nanostructured silica such as silica aerogels that come in the form of micro-balls or sheets.

The necessary electrical connections for the operation of the amplifier and its control, traverse through the wall of the cryostat in a way that the air-tightness of the cryostat is assured, particularly through the sealed connectors.

Also, in order to reduce the thermal load in the cryogenic mode and the cooler power consumption, the size of the low noise amplifier is advantageously reduced by making the amplifier from a microwave monolithic integrated circuit technology.

For proper efficient cooling of the amplifier, the mounting surface of the cryo-cooler cold finger is preferably made of copper or an alloy of copper, and to achieve a level of noise in the amplifier sufficiently low the cryogenic cooler is integrated so as to deliver at the mounting surface of the amplifier an operating cryogenic temperature below 100 Kelvin, preferably in the order of 80 Kelvin.

Such a temperature ensures a sufficiently improved operation of the amplifier, capable of amplifying radio frequency signals across at least one frequency range in the K and Ka bands of between 18 GHz and 40 GHz.

In the case where a desired low vacuum is not maintained permanently in the sealed chamber of the cryostat, the low noise amplifier includes a low vacuum pump that is capable of creating a pressure in the cryostat between the pressure outside the cryostat and a pressure of 0.1 mbar, and the pump is activated for example when the cryogenic cooler is turned on.

For the optimum functioning of the cryogenic cooler and to facilitate the dissipation of heat extracted from the cryostat by the cooler, the cooler preferably includes an external radiator, which can be equipped with a fan to force air circulation between radiator fins.

The invention equally concerns a reception device for radio frequency signals emitted by a satellite or a space object which implements a low noise amplifier according to the invention.

The receiving device includes a control system for the cryogenic cooler that switches the cooler between on the one hand an off-position called Normal Mode, wherein the cryogenic cooler does not produce low temperature cooling and where the amplifier operates at room temperature, and on the other hand an on-position in which the cryogenic cooler lowers the temperature at which the amplifier operates in a mode known as Enhanced Mode.

To ensure an optimal switching between the two modes, the control system of the cryogenic cooler switches from normal mode to enhanced mode or enhanced mode to normal mode, according to parameters received or measured, representative of indicators of quality of the received signal or likely to be received from the satellite or space object, or by any order of an operator.

To the extent that weather conditions are critical in the transmission of signals in the frequency bands considered, measured indicators of a quality level of the signal characterize the local weather conditions existing or expected between the receiving device and the satellite or space object.

In a preferred integration approach, a signal to noise ratio S/N, usually available at the stage of the modulation-demodulation operation of the receiving device, is used as at least one parameter indicative of the signal quality level.

The invention also relates to a method for receiving radio frequency signals emitted by a satellite, by means of a receiving device implementing a low noise amplifier with a normal operating mode at room temperature and an enhanced mode of operation in which a cryogenic cooler maintains an amplifier at a temperature below 100 Kelvin, whereby:

The enhanced mode of the low noise amplifier is activated when a signal to noise ratio S/N measured whilst in normal mode is equal to or less than a first threshold value S1, or the parameters measured and received lead to a determination that the ratio signal to noise S/N, is or may become, less than the first threshold value S1.

The normal mode of the low noise amplifier is activated when a signal to noise ratio S/N measured whilst in enhanced mode, is greater than a second threshold value S2, or when the parameters measured and received lead to determine the signal to noise ratio S/N is greater than the second threshold value S2—the second threshold value S2 in enhanced mode corresponding to a value of signal to noise ratio S/N of the same signal received in the normal mode, equal to or preferably greater than S1.

Thus this approach ensures a reliable radio link using the enhanced mode in situations where there is an identified risk of an interruption of the connection from a significant attenuation of the signal.

Benefits of this method are that the enhanced mode can be activated temporarily, regardless of the value of the signal to noise ratio S/N measured, for example by the action of an operator when the receiving device is needed to ensure the reception of signals during a critical phase such as the tracking phase of a space object.

In this situation, the risks on the link budget of a degradation of signal to noise ratio not detected, or not detected early enough to enable enhanced mode from normal mode, are mitigated.

BRIEF DESCRIPTION OF DRAWINGS

The description of the invention is made with reference to the figures which illustrate schematically and not limited to.

DETAILED DESCRIPTION

Figure 1:
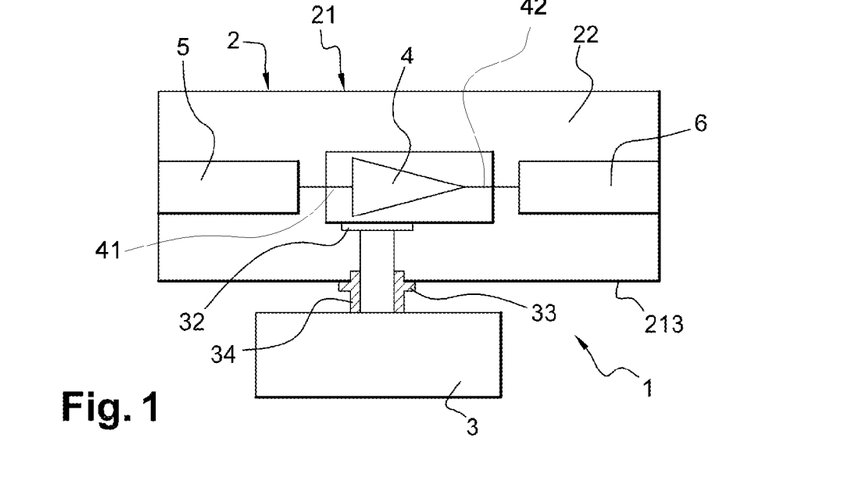
FIG. 1: A schematic diagram of a low noise amplifier according to the invention
Figure 2A:
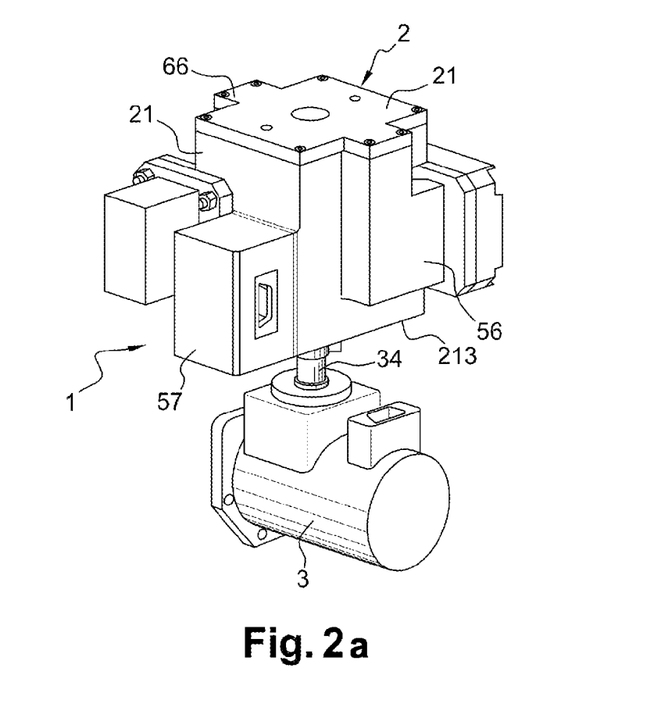
FIG. 2a: A 3D perspective view of one embodiment of a low noise amplifier according to the invention
Figure 2B:
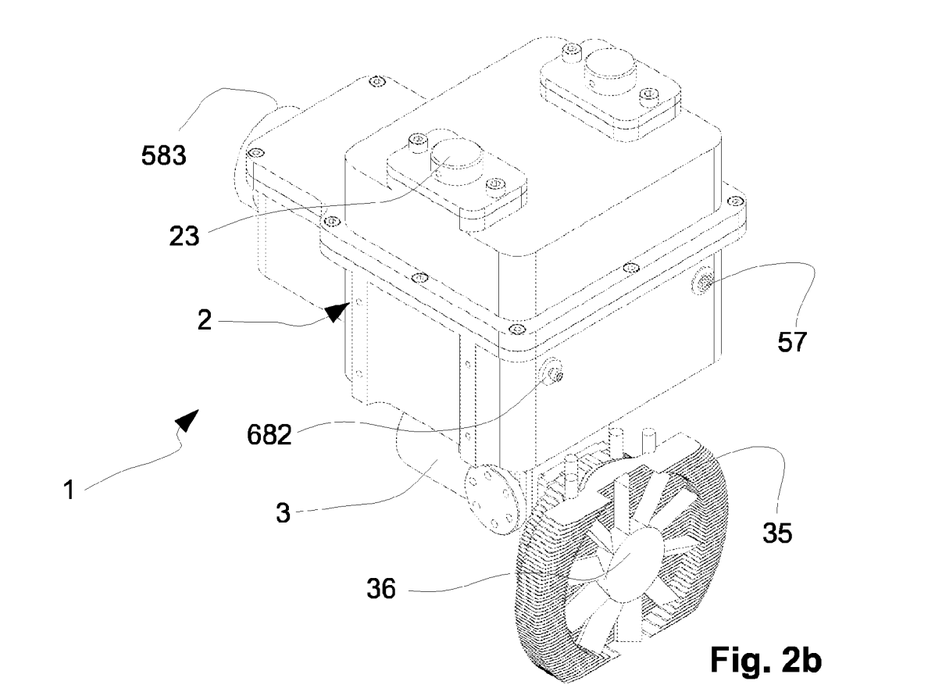
FIG. 2b: A 3D perspective view of another embodiment in which the cryogenic cooler incorporates a fan and a heater

As shown schematically in FIG. 1 and in the perspective views in FIGS. 2a and 2b of an assembled amplifier, a low noise amplifier 1 according to the invention mainly comprises an insulating enclosure or cryostat 2, within which is enclosed an amplifier 4, an input coupler 5, connected to an input 41 of the amplifier 4, and an output coupler 6 connected to an output 42 of the amplifier 4, and a cold source such as a cryogenic cooler 3 on the outside of the cryostat.

The low noise amplifier 1 to be implemented, is such as those intended for integration in a conventional receiver chain (not shown) at atmospheric conditions, for the reception of RF signals from a satellite.

A cold finger 31 of the cryogenic cooler 3 traverses through the cryostat wall 21 so that a mounting surface 32 of the cold finger inside the cryostat 2 is in direct contact with a surface of the amplifier 4, or at least with a mounting plate supporting the amplifier.

The cryogenic cooler can be of any design capable of cooling to temperatures below 100 Kelvin.

Known coolers for example use Stirling technology to generate cold, having the advantage of producing low temperatures as an integrated unit in a limited volume.

In this type of solution, it is usually possible to transfer the heat extracted from the cryostat by the cryogenic cooler, to the atmosphere air by convection. This solution can be very effective even in cases of high humidity without damaging the cryogenic amplifier. An advantageous feature of the configuration shown in FIG. 2b, is that the cryogenic cooler 3 is equipped with a radiator 35 such as a finned radiator—if the surrounding air is not circulating sufficiently, a fan 36 coupled to the radiator forces the air circulation to remove heat efficiently.

The interface of the cold finger 31, completely inert, is made of a high heat conducting material, such as copper or an alloy of copper or another metal having good thermal conduction properties. The interface is connected to the cryogenic cooler 3 so that it provides an effective conductive heat transfer between the cooler 3 and the amplifier 4.

The amplifier 4 is itself a conventional amplifier model that is capable of operating at ambient temperatures and at low temperatures.

In the preferred configuration described, the amplifier 4 is a microwave monolithic integrated circuit, referred to as MMIC technology, so that the amplifier is as small as possible, to help limit the required size of the cryostat 2 and the cooler 3, required for the cooling and maintaining of the cryogenic temperature whilst in cryogenic operating mode.

The cryostat 2 and arrangement of components inside the cryostat are conceived not only to achieve the desired cryogenic temperature levels of the amplifier 4, but to also minimize the loss of thermal energy, and therefore improve the efficiency of the cryogenic cooler 3, reducing the required size and power consumption when cooling.

This is the reason that the envelope 21 of the cryostat 2 is sealed to isolate an internal volume of the casing, relative to the space outside the cryostat.

The cryostat 2 is for example made by machining a chamber in a block of resistant material, such as a metal block, with the chamber being closed by a sealed cover, using an O-ring or other suitable type of seal, in order to limit any heat loss between the inside and outside of the cryostat, due to a flow of gas between the inside and outside of the chamber.

Different ports are necessary for the operation of the amplifier, but they are conceived so as to maintain the air-tight sealing of the cryostat 2.

And therefore a seal is provided at the wall 21 where the cold finger 31 of the cryogenic cooler traverses the cryostat.

In a preferred configuration, the part of the cold finger 31 which lies in part outside the cryostat 2, includes an envelope with an insulation material 34, which has a shoulder 33 resting on the outside of the wall 213 and traversing the cryostat 2.

A gasket placed between the wall and the aforementioned shoulder, assures both the sealing and thermal insulation with respect to the surface 213, in order to limit any loss of cooling of the amplifier 4.

For the same reasons, the cold finger 31 passes through the wall 21 without contact, the opening 213 being of a larger size than that of the finger 31, and less than that of the shoulder.

The air-tightness is ensured by sealed connectors traversing the cryostat, to allow for the radio frequency signal connections and continuous signal connections, such as the power supply and amplifier control and monitoring signals—in particular for measuring the temperature to regulate the operation of the cryogenic amplifier.

Figure 3A:
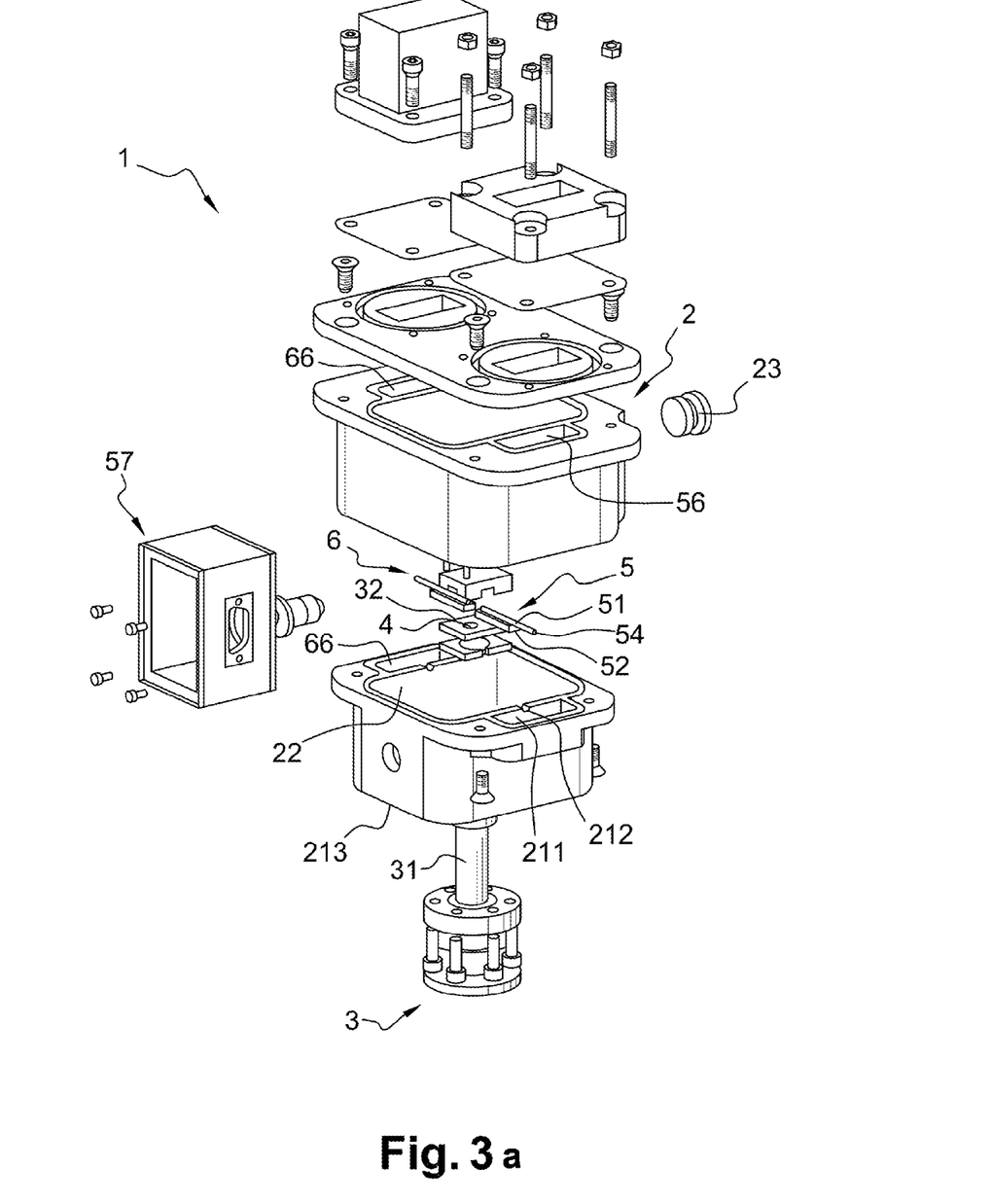
FIG. 3a: An exploded 3D perspective view of the low noise amplifier and its main components.
Figure 4A:
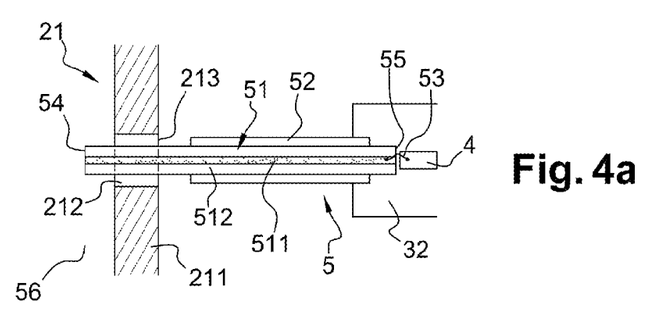
FIGS. 4a and 4b: Schematic top view and profile of a coupler with microstrip line
Figure 4B:
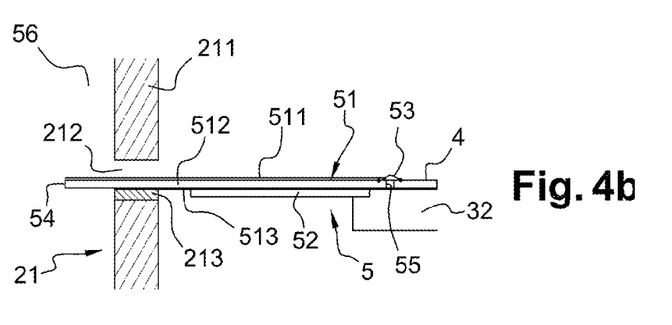

In one configuration, for the entrance of the radio frequency signal to the amplifier 4, the input coupler 5 is achieved by means of an element called a microstrip line 51, as shown in FIGS. 3a, 4a and 4b.

The microstrip line 51 itself comprises a narrow strip of electrically conductive material, referred to as microstrip 511, forming a conductive path and made up of an upper surface of a thin dielectric plate 512, having a width greater than the aforementioned microstrip 511, on which on the lower, opposite surface of the plate, has a thin conductive metallized layer 513, forming an electrical ground plane for the microstrip 511.

For mechanical reasons, the microstrip line is secured to a support arm 52 made up of a dielectric material that extends between a support of the amplifier 4 (in practice the mounting surface 32 on which is placed the amplifier 4), and the wall 21 of the cryostat 2, specifically at a side of the wall 21 that forms an interior wall 211 of the waveguide 56.

At a first "free" end 54, the microstrip line extends beyond the support arm 52 and passes through an aperture or iris 212 of the wall of the waveguide 211 to penetrate inside the waveguide 56.

At its passage through the iris 212, the microstrip line is adhered to (for example by gluing) a plate 213 of a low-loss dielectric material at the metallized layer 513, without the microstrip's edges being in contact with the edges of the iris—the opening of the iris being defined according to the dimensions of the microstrip line to achieve this.

For the low-loss dielectric material, it is generally understood by an experienced engineer that it is to select among the materials known to have good dielectric properties at the frequencies under consideration, given that the material is acceptable in terms of technical and economic constraints.

It is understood that the positioning and the traversing of the wall of the waveguide 211 are conceived without metal contact between the wall of the waveguide 211 and the microstrip line 51.

Whilst the iris 212 is left partially open, the desired sealing of the chamber 22 may be provided by a window of a dielectric material in the waveguide 56.

At an opposite end to the free end 54, referred to as the inner end 55, the microstrip line stops before the amplifier 4, to which the connection is made by an interconnecting wire 53.

The support arm 52, which supports the microstrip line 51 between the support of the amplifier 4 and the wall 211 of the waveguide 56, is secured to the support of the amplifier 4 at the inner end of the microstrip line 51, and ends before the wall 211 of the waveguide 56, so as not to be in contact with the aforementioned wall.

In practice one to two millimeters are sufficient between the end of the support arm 52 and the wall 211 of the waveguide, to avoid contact without weakening the strength of the microstrip line 51.

Such an arrangement of the input coupler 5, minimizes the heat transfer from the amplifier 4 to the outside of the cryostat 2 by the coupler 5, which would have the effect of reducing the cryogenic cooler's cooling efficiency of the amplifier 4, and maintains the transfer of the radio frequency strength between the microstrip 511 and the waveguide 56, with the minimum of physical contact and heat conduction.

At the RF signal output of the amplifier 4, the output coupler 6 is arranged similarly to the input coupler 5, in this case the free end of the microstrip line passes through the wall of the cryostat corresponding to the waveguide wall 66.

In another configuration, the input couplers 5 and output couplers 6 are conceived in a similar manner by means of waveguides inside the cryostat 2.

Figure 3B:
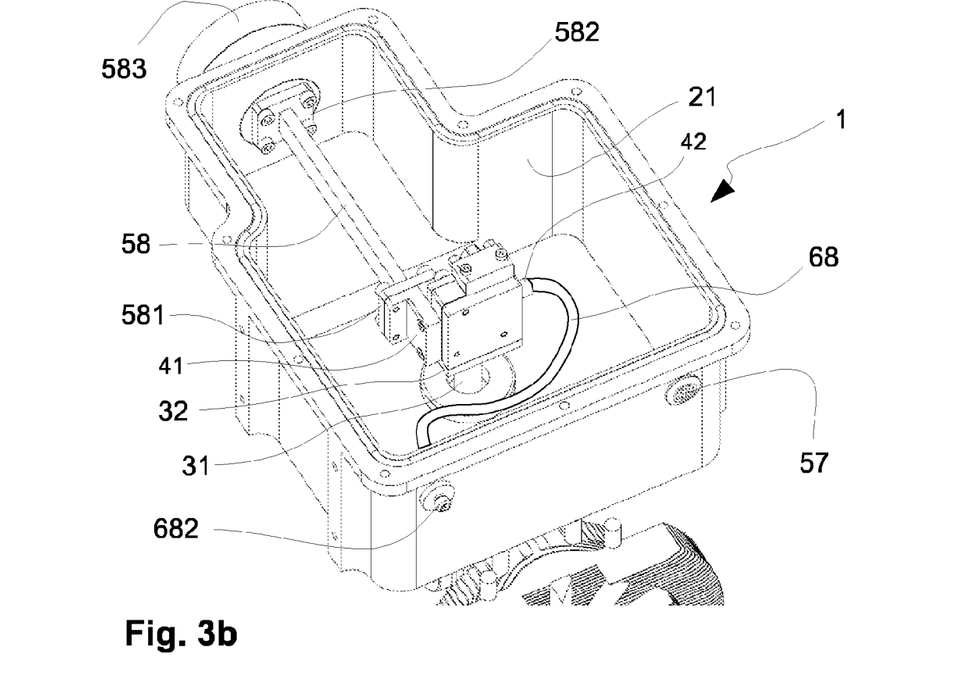
FIG. 3b is a view inside the cryostat corresponding to the configuration from FIG. 2b with a mixed coupling by waveguide and coaxial cable to the amplifier

This configuration is illustrated in FIG. 3b in the case of the input coupler 5 at the radio frequency signal input of the amplifier 4—the input coupler 5 is achieved by means of a waveguide 58.

The waveguide 58 is fixed to an inner end 581 at the input 41 of the amplifier 4, in this case by a flange of the waveguide on the amplifier housing, and an outer end 582 at a crossing of the wall 21 of the cryostat, outside of which is arranged a connection interface or waveguide window 583 to an antenna waveguide (not shown FIG. 3b).

The mounting of the waveguide 58 is achieved at its ends 581, 582 in order on one hand to respect the general installation constraints of waveguides especially for electrical continuity of the walls of the waveguide, and on the other hand to meet the sealing constraints required in this application, between the inside of the cryostat 2 and the outside of the cryostat.

The desired seal between the external environment to the cryostat and the outer end 582 of the waveguide is obtained by a tight fitting of the waveguide window on the wall of the cryostat, and by closing the waveguide window by a sheet of a dielectric material held tightly between two parts of the waveguide window which enclose the sheet with pressure seals.

In this configuration of the input coupler 5, performance in terms of radio signal coupling is very good, but the waveguide forms a direct physical contact between the amplifier 4 cooled by the cold finger 31 of the cryogenic cooler 3 and the wall 21 of the cryostat 2, with heat conduction that is detrimental to maintaining the temperature at the lowest possible level of the amplifier 4.

This particular problem is solved by making the waveguide 58 of a metallic material with poor heat conduction characteristics, i.e. thermal conductivity less than 50 W/m·K.

Preferably, the waveguide 58 is made of a non-oxidizable materials such as stainless steel of which the thermal conductivity is of about 16 W/m·K, or of iron-nickel alloys with high nickel content (Invar® type) with approximately 36% nickel, whose thermal conductivity is about 13 W/m·K—these values compare with those of aluminum or copper respectively of about 200 and 350 W/m·K.

Low thermal conductivity of metals is accompanied by low electrical conductivity, and hence to obtain a good performance of a waveguide with electrical continuity between the entrance of the cryostat 2 and the input 41 of the amplifier 4, a thin deposit of a material with high electrical conductivity is used to cover the surface of the waveguide inner wall 58 (not visible in the figures) of the cryogenic amplifier invention.

Such a material is, for example, silver (electrical conductivity $62 \times 10^6$ Siemens/m), copper (electrical conductivity $58 \times 10^6$ Siemens/m), or gold (electrical conductivity $44 \times 10^6$ Siemens/m).

Other metals are also possible for which the electrical conductivity is much higher than that of stainless steel or Invar®, and whose electrical conductivity is in the order of $\times 10^6$ Siemens/m, but it is necessary to take into account in the selection of the high electrical conductivity material the other characteristics such as its corrosion resistance and ability to be deposited in a thin layer of a few microns onto the metallic material of low thermal conductivity, preferably between 1 and 5 microns in thickness (typically 3 microns).

In another configuration, the input coupler 5 and output coupler 6 are both conceived using coaxial cables inside the cryostat.

This configuration is illustrated in FIG. 3b, where the output coupler 6 at the radiofrequency signal output 42 from the amplifier 4, is achieved by means of a coaxial cable 68.

In this configuration, the output signal is transmitted through a coaxial cable 68 from exit 42 of the amplifier 4, to a sealed coaxial jack 682 that traverses through the wall 21 of the cryostat.

By the nature its material, the coaxial cable 68 itself is a sufficient thermal insulator to not to disturb the thermal operation of the low noise amplifier 1.

As illustrated in FIG. 3b, the various configurations of the input couplers 5 and output couplers 6 can be combined, depending on the context of operation and the expected performance of the low noise amplifier.

In practice a solution implementing coaxial cables for the input and output couplers, should preferably be reserved for the low-frequency ranges, below the principle frequencies considered. Implementing input and output couplers using waveguides will be preferred in cases where the priority is to reduce the transmission losses, which are proportionally more significant the higher the frequencies to be amplified.

In the configuration illustrated in FIG. 3b, the input coupler 5 uses a waveguide 58 and the output coupler 6 uses a coaxial cable 68, a solution which is acceptable in practice since the transmission losses of the amplified signal are less critical than the input signal losses before amplification.

The cryostat 2 represents a sealed chamber 22, in which the amplifier 4 is located.

The sealed chamber is allowed to fill with a gas at the external environment pressure, i.e. the chamber is closed at ambient pressure during manufacture or during a repair operation, and no high vacuum being required in the chamber at any later stage.

The gas in the chamber is air for example, preferably a dry air, or an inert gas without moisture, such as nitrogen or argon.

Although the low noise amplifier of the invention can be implemented by keeping the inside of the cryostat 2 at ambient pressure, a low vacuum (i.e. corresponding to a pressure between ambient pressure and 0.1 millibar) is beneficial in substantially reducing thermal losses, without requiring when the cryostat temperature is cycled from cold to room temperature, to repeat the low vacuum evacuation.

Furthermore, a low vacuum is achievable without any particular difficulty using a conventional mechanical primary vacuum suction pump, unlike when creating a high vacuum which requires in addition to the vacuum pump the use of a turbomolecular pump, for which the implementation difficulties are incompatible with the operational objectives intended for the low noise amplifier of the invention.

To capitalize on the low vacuum advantage, the wall 21 of the cryostat has a suction valve port which is connected to such types of low vacuum pumps. The vacuum can be established at the factory or at a workshop, or performed on-demand in the case that a vacuum pump might be connected permanently to the low noise amplifier.

In avoiding the use of high vacuums in the cryostat 2, the seal is much simpler to achieve, and the low vacuum is maintained without difficulty (as long as the cryostat is not opened for a maintenance or repair), in contrast to the known issues of vacuum maintenance in the case of cryogenic amplifiers in high vacuum cryostats.

In a preferred configuration, the chamber 22 at ambient pressure or at a low vacuum level, is filled with a thermal insulating material that improves insulation by reducing the various modes of heat dissipation (conduction, convection and radiation).

Preferably, the insulation filling the chamber 22 is a nanostructured material with low density, such as a silica SiO2 nanostructured material.

This type of insulation is available as an Aerogel silica which is commercially available in the form of beads or sheets that can be deposited in layers. The chamber is filled with micro-beads for example through an orifice, not shown in the drawings, on one side of the sealed chamber—an orifice which is closed by a air-tight plug 23 in operational conditions.

The amplifier 4 is maintained with minimum heat exchange with the outside atmosphere, other than the cooling exchange via the cold finger 31 of the cryogenic cooler 3, and without the chamber 22 of the cryostat needing to have a high vacuum established before the operation of the cooler.

One or more hermetic connectors 57 are arranged on one side of the wall 21 of the cryostat 2.

These connectors are for connecting from the outside of the cryostat 2 the electrical connections for the power supply and the polarization of the amplifier 4, and to monitor the operation of the various components and the temperature inside the cryostat—for example using conventional thermal sensors to control the power supply to the cryogenic cooler 3.

Due to its specific design, the low noise amplifier 1 of the invention has two alternative modes of operation.

In a first, "normal mode", the cryogenic cooler 3 is stopped (and if a low vacuum pump is connected, it is also stopped) and the amplifier 4 operates at room temperature or an ambient temperature of typically 288 Kelvin on average.

The normal mode is sufficient in most weather conditions encountered in operation, ensuring the desired performance of the link with the satellite. The amplifier 4 is conceived for low noise in these temperature conditions, with a satisfactory signal to noise ratio during the ordinary conditions of the link.

In a second, "enhanced mode", the cryogenic cooler 3 is running (and likewise the low vacuum pump is running if the cryostat is kept connected to such a pump—which will generally not be necessary when the low vacuum has been established in the workshop), and cools the amplifier 4 through the cold finger 31 to a low temperature, below 100 Kelvin (80 Kelvin for example).

In this second mode, the amplifier 4 operates with a level of internal thermal noise particularly low due to the lowered temperature, and the reception performance is able to be maintained under adverse weather conditions thanks to the amplifier 4's very low noise.

This second mode is active only in the exceptional case of unfavorable weather conditions, during which power consumption increases and there os mechanical wear of the cryogenic cooler. That is for most operational situations, it is active only for a small percentage of the time, compared to the time when the sensitivity at room temperature of the receiving device is sufficient for the average weather conditions of the receiver's location. This has the effect of reducing the overall power consumption of the amplifier compared to a conventional cryogenic amplifier implementation, and correspondingly increases the lifetime and reliability of the cryogenic cooler.

Figure 5:
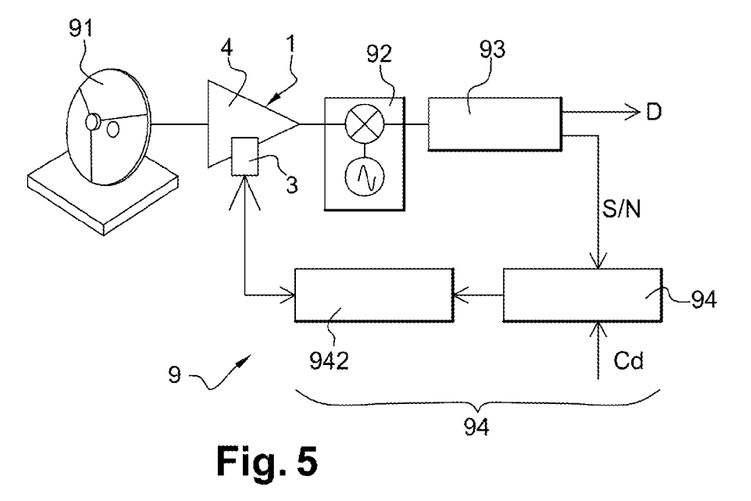
FIG. 5: Schematic diagram of a receiving device incorporating a low noise amplifier according to the invention.

A receiving device 9, as shown in FIG. 5, implementing a low noise amplifier 1 of the invention and connected to an antenna 91, thus includes a control system 94 of the low noise amplifier, which ensures the starting and stopping of the cryogenic cooler 3 according to an acceptable noise level S/N, given the quality of the signal received or expected.

In an example of the control function, the cryogenic cooler 3 is turned on or off depending on the signal quality, or more specifically the signal to noise ratio S/N, which is generally available from the reception system 9 that incorporates the low noise amplifier 1, at a modulation-demodulation stage 93 whose output is delivered in the transmitted data D after a frequency conversion performed by a converter 92.

When the cryogenic cooler 3 is stopped and the signal to noise ratio S/N drops below a predefined first threshold value S1, but which exceeds a threshold below which the transmission performance is below an acceptable level (i.e. resulting in an unacceptable loss of data D), the control system 94 starts the cryogenic cooler 3 and regulates its operation in order to maintain a controlled temperature, e.g. 80 Kelvin, at the amplifier 4.

When the cryogenic cooler 3 is activated, the control system 94 regulates its operation to maintain the desired temperature of the amplifier 4, as long as the signal to noise ratio S/N does not reach, from a lower value, a second threshold value S2—once S2 is reached or exceeded, the operation of the cryogenic cooler 3 is stopped.

The second threshold value S2, considered here whilst in enhanced mode, is set at a signal to noise ratio of the amplifier in normal mode, equal to and preferably higher, by at least one measurable unit, to the first threshold value S1.

The control system 94 benefits from a means of calculation 941, for example incorporating a processor or a microcontroller, and a controller 942, which provides the activation and deactivation of the cryogenic cooler 3.

The choice of thresholds S1 and S2 can regulate the transition between normal and enhanced modes with a hysteresis that prevents a continuous jumping between the two modes.

In another example of the control function that can be combined with the previous example, the cryogenic cooler 3 is turned on or off depending on external data Cd from the receiver system incorporating the low noise amplifier, for example weather data from the antenna 91, or the space object transmitting data or information on the quality of a link (to anticipate a risk of degradation of the quality of the link with the space object), or even data generated from a specific signal emitted by the space object to measure the current quality of signal propagation, and set which operating mode of the amplifier 1 should be active.

When a link is considered particularly critical, the processor 941 can activate on a Cd instruction the continuous operation of the cryogenic cooler 3, in order to avoid loss of data D in any case of an unforeseen decrease in signal quality.

An operator can also make use of a manual command mode, to force one mode or the other at their request.

The choice of thresholds and in general the conditions determining the start-up of the cryogenic cooler 3, take into account the time required for the temperature of the amplifier 4 to be lowered to the desired nominal cryogenic conditions, before the link may have deteriorated to such an extent that data loss is at an unacceptable level while the amplifier was running at room temperature or was insufficiently cooled.

The system of the switchable low noise amplification of the invention thus improves the reception of data transmitted by a satellite, with no loss of transmission performance in a wide range of contexts and with an amplifier of small size, by adapting in real-time the internal noise of the amplifier according to reception conditions.

The invention is not limited to the implementation described, since an experienced operator would be able to apply the principles of the functionality for other operating modes.

In particular, components such as filters or oscillators which also benefit from being cooled in the enhanced mode, may be associated with the amplifier to be cooled in the principle of the invention.

The arrangement of the components of the low noise amplifier and the performance of thermal insulation that is achieved, enable the conception of a low noise amplifier for receiving radio frequency signals in two modes of different sensitivities, and with reduced dimensions compared to conventional cryogenic amplifiers.

In practice it has proven possible without developing special cryogenic cooler technologies 3, to achieve a low noise amplifier with two modes of operation as shown in FIG. 2, corresponding to the dimensions of a cube enclosure of less than 20 cm along each dimension.

The invention claimed is:

1. A low noise amplifier device for receiving a radio frequency signal from a satellite or a space object comprising an amplifier kept in a sealed chamber defined by a wall of a cryostat, and comprising a cryogenic cooler attached to the exterior of the cryostat at a face of the wall wherein the amplifier is:
   maintained in the sealed chamber secured to a mounting surface located at the end of a cold finger of the cryogenic cooler, of which the mounting surface of the cold finger is made of a material of good conductance of heat, the cold finger traversing without direct contact the face of the wall;

connected to an input coupler at an input of the amplifier and an output coupler at an output of the amplifier, the said input coupler and output couplers traverse the wall of the cryostat;

the amplifier inside the cryostat functioning on the one hand at an ambient temperature around 288 Kelvin and the other at a cryogenic temperature well below room temperature;

and wherein the sealed chamber of the cryostat contains, at least during operation mode at cryogenic temperature, a gas at a pressure between the pressure outside the cryostat and a pressure of approximately 0.1 millibar.

2. The low noise amplifier according to claim 1, wherein the input coupler comprises a waveguide attached to an inner end at the input of the amplifier and to an outer end in a sealed port in the wall of the cryostat without electrical discontinuity between the input of the amplifier and an interface for connecting a receiving antenna to a waveguide window, and wherein the output coupler comprises a waveguide arranged similarly to the waveguide of the input coupler.

3. The low noise amplifier according to claim 2, in which one or more waveguides consist primarily of a metal material with low thermal conductivity, preferably less than 50 W/m·K, by example belongs to the class of stainless steels or iron-nickel alloys containing approximately 36% nickel, and includes at on the inner surface of the waveguide a thin deposit of a material of high electrical conductivity, preferably greater than $40 \times 10^6$ Siemens/m, which is a high electrical conductivity metal selected from silver, copper or gold.

4. The low noise amplifier according to claim 1, wherein the output coupler includes a coaxial cable between the output of the amplifier and an air-tight sealed coaxial jack traversing through the wall of the cryostat wherein the input coupler has, similarly to the output coupler, a coaxial cable between the input of the amplifier and an air-tight sealed coaxial jack traversing through the wall of the cryostat.

5. The low noise amplifier according to claim 1, wherein the input coupler comprises a waveguide attached to an inner end at the input of the amplifier and an outer end through a sealed port in the wall of the cryostat without electrical discontinuity between the input of the amplifier and an interface for connecting a receiving antenna to a waveguide window, and wherein the output coupler comprises a coaxial cable between the output of the amplifier and an air-tight sealed coaxial jack traversing the wall of the cryostat.

6. The low noise amplifier according to claim 5, in which one or more waveguides consist primarily of a metal material with low thermal conductivity, preferably less than 50 W/m·K, by example belongs to the class of stainless steels or iron-nickel alloys containing approximately 36% nickel, and includes at on the inner surface of the waveguide a thin deposit of a material of high electrical conductivity, preferably greater than $40 \times 10^6$ Siemens/m, by example a high electrical conductivity metal selected from silver, copper or gold.

7. The low noise amplifier according to claim 1, wherein at least one coupler traverses through the wall through an iris at the wall of a waveguide and:

includes a microstrip line comprising:

a micro-strip of an electrically conductive material;

said microstrip being attached on an upper face of a thin dielectric plate;

said thin dielectric plate having a metalized layer on a lower face opposed to the upper face and forming an electrical ground plane;

the microstrip line extending at a free end into the waveguide across the wall of the waveguide through the iris, without metal contact between the microstrip line and the wall of the waveguide;

the microstrip line extending at a inner end, opposite to the free end, up to near the amplifier with no direct contact with the amplifier;

the microstrip line being devoid of the metalized layer along the portion of the microstrip line that is located inside the waveguide.

8. The low noise amplifier according to claim 7 in which the microstrip line is maintained in the waveguide iris resting on a plate of a low loss dielectric material and is secured to a support arm, said support arm being secured to a support of the amplifier near the inner end of the microstrip line, said support arm stopping prior to the free end of the microstrip line so as to be kept close to, but not in contact with the wall of the waveguide.

9. The low noise amplifier according to claim 1 in which the sealed chamber contains a thermally insulating material, or a nanostructured material based on silica Aerogels.

10. The low noise amplifier according to claim 1 in which the amplifier is an amplifier based on microwave monolithic integrated circuit (MMIC) technology.

11. The low noise amplifier according to claim 1 in which the mounting surface of the cold finger is made of copper and delivers to the level of the mounting surface a temperature corresponding to the cryogenic temperature of operation of the amplifier below 100 Kelvin, of preferably approximately 80 Kelvin.

12. A reception device of RF signals emitted by a satellite or a space object, comprising a low noise amplifier device for receiving a radio frequency signal from a satellite or a space object comprising an amplifier kept in a sealed chamber defined by a wall of a cryostat, and comprising a cryogenic cooler attached to the exterior of the cryostat at a face of the wall wherein the amplifier is:

maintained in the sealed chamber secured to a mounting surface located at the end of a cold finger of the cryogenic cooler, of which the mounting surface of the cold finger is made of a material of good conductance of heat, the cold finger traversing without direct contact the face of the wall;

connected to an input coupler at an input of the amplifier and an output coupler at an output of the amplifier, the said input coupler and output couplers traverse the wall of the cryostat;

functioning inside the cryostat at an ambient temperature around 288 Kelvin and at a cryogenic temperature well below room temperature;

and wherein the sealed chamber of the cryostat contains, at least during operation mode at cryogenic temperature, a gas at a pressure between the pressure outside the cryostat and a pressure of approximately 0.1 millibar; and wherein the reception device includes a control system of cryogenic coolers to switch the cooler between an "off" position where the cooler does not drop to a low temperature and where the amplifier operates in a normal mode at room temperature, and an "on" position in which the cryogenic cooler lowers the temperature at which the amplifier operates in an enhanced mode.

13. The device for receiving radio frequency signals as in claim 12, wherein the control system of the cryogenic cooler switches from normal mode to enhanced mode or from enhanced mode to normal mode according to parameters, received or measured, consistent with a signal reception quality, or likely to be received from the satellite or space object.

14. The device for receiving radio frequency signals according to claim 13 in which the signal to noise ratio S/N from signals received from the satellite or space object is used as at least one of the parameters indicative of a signal quality level.

15. A device for receiving radio frequency signals as in claim 12, wherein the control system of the cryogenic cooler switches from normal mode to enhanced mode or from enhanced mode to normal mode according to received or measured parameters which typify existing or expected local weather conditions between the receiving device and the satellite.

* * * * *